(12) United States Patent
Chung et al.

(10) Patent No.: US 10,761,137 B1
(45) Date of Patent: Sep. 1, 2020

(54) FLEXIBLE MANUFACTURING FLOW ENABLED BY ADAPTIVE BINNING SYSTEM

(71) Applicant: Xilinx, Inc., San Jose, CA (US)

(72) Inventors: Lee N. Chung, San Jose, CA (US); Randy J. Simmons, San Jose, CA (US); Arnold Louie, Cupertino, CA (US); Dahshi Shen, Milpitas, CA (US); Felino E. Pagaduan, Morgan Hill, CA (US); Tony Le, San Jose, CA (US)

(73) Assignee: XILINX, INC., San Jose, CA (US)

( * ) Notice: Subject to any disclaimer, the term of this patent is extended or adjusted under 35 U.S.C. 154(b) by 364 days.

(21) Appl. No.: 15/860,925

(22) Filed: Jan. 3, 2018

(51) Int. Cl.
| | | |
|---|---|---|
| *G06F 30/00* | (2020.01) | |
| *G01R 31/317* | (2006.01) | |
| *G01R 31/28* | (2006.01) | |
| *G01R 31/3185* | (2006.01) | |
| *G06F 16/28* | (2019.01) | |

(52) U.S. Cl.
CPC ... *G01R 31/31718* (2013.01); *G01R 31/2851* (2013.01); *G01R 31/318505* (2013.01); *G06F 16/285* (2019.01)

(58) Field of Classification Search
CPC .......................... G01R 31/31718; G06F 16/285
USPC ......................................................... 716/136
See application file for complete search history.

(56) References Cited

U.S. PATENT DOCUMENTS

| | | | | |
|---|---|---|---|---|
| 2011/0010215 A1* | 1/2011 | Lin | ........................ | G06Q 10/06 705/7.31 |
| 2011/0106497 A1* | 5/2011 | Visweswariah | ......... | G06F 30/30 702/182 |
| 2014/0184262 A1* | 7/2014 | Poindexter | ......... | G01R 31/2853 324/759.03 |

* cited by examiner

*Primary Examiner* — Suchin Parihar
(74) *Attorney, Agent, or Firm* — Patterson + Sheridan, LLP (57) ABSTRACT

Embodiments herein describe techniques for binning integrated circuits (ICs) using an adaptive binning system that can re-bin the ICs in response to receiving a new or updated test specification. Unlike static binning systems, in one embodiment, the binning system receives measured test data from a testing system. Put differently, instead of a testing apparatus simply indicating whether an IC does (or does not) satisfy the criteria in the test specification, the testing apparatus provides measured test data to the binning system. The binning apparatus can then store the received test data. As such, if a new test specification is received or generated, the binning system can use the already saved test data to re-bin the ICs using the criteria in the new test specification without having to re-test the ICs. In this manner, the binning system can re-categorize the ICs as customer needs or customer demand changes.

20 Claims, 5 Drawing Sheets

FLEXIBLE MANUFACTURING FLOW ENABLED BY ADAPTIVE BINNING SYSTEM

TECHNICAL FIELD

Examples of the present disclosure generally relate to binning integrated circuits (ICs).

BACKGROUND

Binning is used to categorize ICs formed on wafers. Due to process variations, ICs formed on the same wafer can nonetheless have different performance or power parameters. For example, one IC may have lower minimum operating voltage or operate at a higher clock speed than another IC fabricated on the same wafer. Binning permits the manufacture to categorize the ICs into one or more groups or bins by testing the ICs using a test specification. For example, Bin A may contain ICs that satisfy a first criteria of the test specification, Bin B contains ICs that satisfy a second criteria of the test specification, and Bin C contains ICs satisfying a third criteria of the specification. By testing the ICs using the criteria in the test specification, the binning system can categorize the ICs into Bin A, B, or C.

However, binning is a fixed process. That is, after categorizing the ICs into a bin, the ICs cannot then be re-categorized without again attaching the ICs to the testing system. Put differently, when binning the ICs, the testing system simply determines whether an IC past or fails a certain test (e.g., whether the IC has a desired operating power, minimum operational frequency, minimum operating voltage, maximum heat generation, and the like). If later the manufacture wants to re-bin the ICs using a different test specification (which may have different criteria or set different operating thresholds), the ICs cannot be re-categorized without configuring the testing system using the new test specification and re-testing the ICs. As such, re-binning the ICs may be prohibitively expensive and time consuming.

SUMMARY

Techniques for binning integrated circuits are described. One example is a method that includes testing a plurality of integrated circuits to measure test data where the test data comprises at least one of a performance parameter and a power parameter for the plurality of integrated circuits and categorizing the plurality of integrated circuits into a plurality of bins by evaluating the test data using a test specification where the test specification includes one or more criteria used evaluate at least one of the performance parameter and the power parameter to assign the plurality of integrated circuits to at least one of the plurality of bins. The method includes determining a re-binning event where the test specification is changed and re-categorizing the plurality of integrated circuits by evaluating the test data using the changed test specification where at least one of the plurality of integrated circuits is assigned to a different one of the plurality of bins.

One example described herein is a computing system that includes a processor and memory binning algorithms that, when executed by the computing system perform an operation. The operation includes receiving test data generated by testing a plurality of integrated circuits where the test data comprises at least one of a performance parameter and a power parameter for the plurality of integrated circuits and categorizing the plurality of integrated circuits into a plurality of bins by evaluating the test data using a test specification where the test specification includes one or more criteria used evaluate at least one of the performance parameter and the power parameter to assign the plurality of integrated circuits to at least one of the plurality of bins. The operation includes determining a re-binning event where the test specification is changed and re-categorizing the plurality of integrated circuits by evaluating the test data using the changed test specification where at least one of the plurality of integrated circuits is assigned to a different one of the plurality of bins.

One example includes a computer readable storage medium that has computer-readable program code for binning a plurality of integrated circuits, wherein, when executed by a computing processor, the computer-readable program code performs an operation. The operation includes receiving test data generated by testing a plurality of integrated circuits where the test data comprises at least one of a performance parameter and a power parameter for the plurality of integrated circuits and categorizing the plurality of integrated circuits into a plurality of bins by evaluating the test data using a test specification where the test specification includes one or more criteria used evaluate at least one of the performance parameter and the power parameter to assign the plurality of integrated circuits to at least one of the plurality of bins. The operation includes determining a re-binning event where the test specification is changed and re-categorizing the plurality of integrated circuits by evaluating the test data using the changed test specification where at least one of the plurality of integrated circuits is assigned to a different one of the plurality of bins.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe techniques for binning ICs using an adaptive binning system that can re-bin the ICs in response to receiving a new or updated test specification. Unlike static binning systems that determine only whether the ICs satisfy the criteria in the test specification, the embodiments herein describe a binning system that receives test data (e.g., measured test data) from a testing system. Put differently, instead of a testing system simply indicating whether an IC does, or does not, satisfy the criteria in the test specification, the testing system provides measured test data to the binning system such as the ICs minimum operating voltage, minimum and maximum power consumption, maximum clock speed, Block RAM speed, PCIe performance, digital signal processing (DSP) performance, and the like. The binning system stores the received test data which then can be compared to a test specification. As such, if the test specification is updated or a new test specification is received, the binning system can use the already saved test data to re-bin the ICs using the criteria in the changed test specification without having to re-test the ICs. In this manner, the binning system can re-categorize the ICs as customer needs or demand changes.

Figure 1:
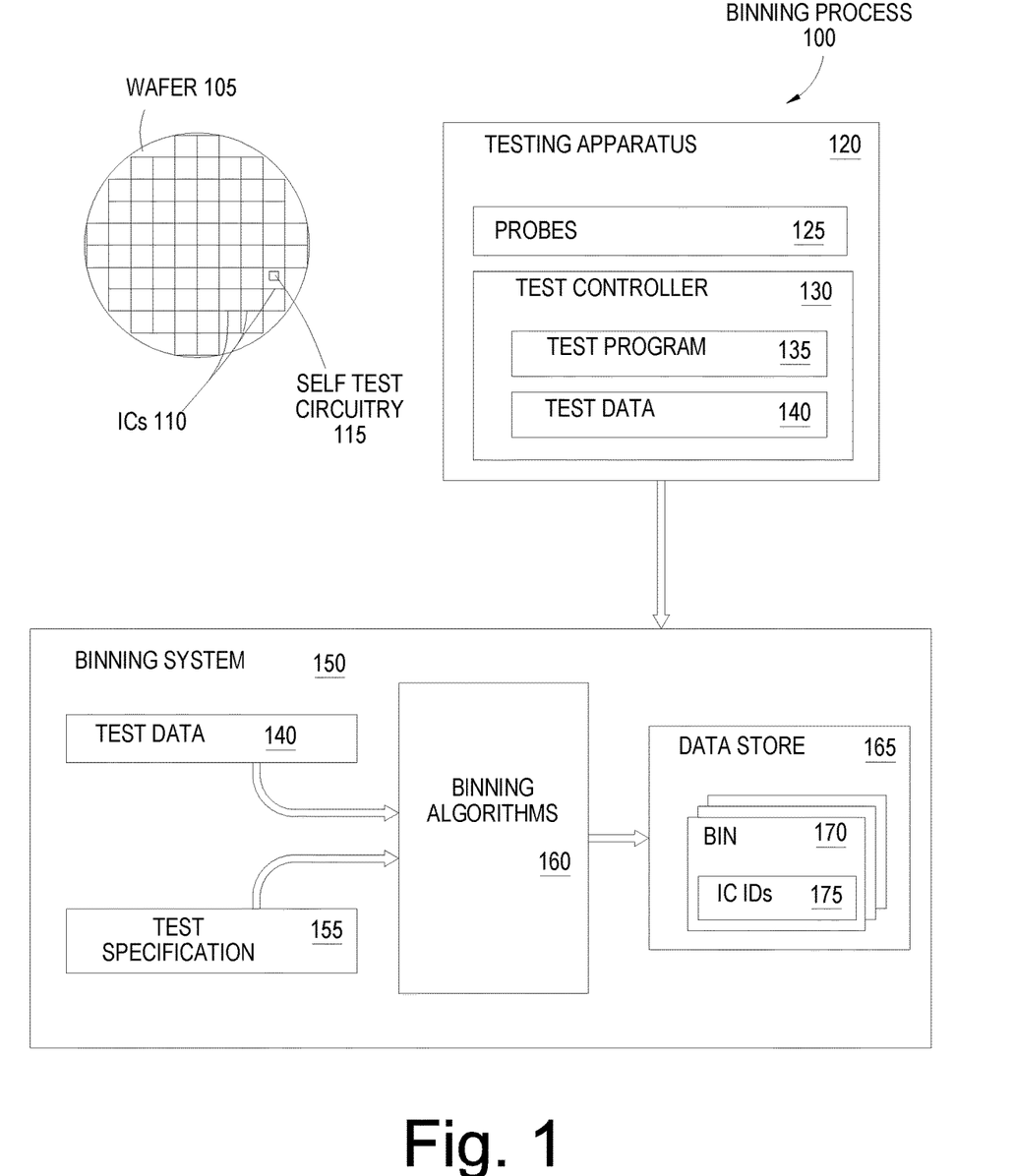
FIG. 1 is a block diagram of a binning process where ICs can be re-binned, according to an example.

FIG. 1 is a block diagram of a binning process 100 where ICs can be re-binned, according to an example. Generally, the binning process 100 includes categorizing a plurality of ICs 110 in a wafer 105 into bins 170. The ICs 110 may be fabricated in the wafer 105 which may include one or more semiconductor materials. Although the ICs 110 may be formed using the same fabrication process, the ICs 110 may nonetheless have different performance or power parameters. That is, the performance of the ICs 110 may vary depending on their locations on the wafer 105. As such, the operating frequency, power consumption, memory speed, etc., of the ICs 110 can vary.

The ICs 110 may include processing elements, memory elements, configurable memory, digital signal processors, hardware accelerators, CMOS circuits, and the like. Although the embodiments herein discuss binning ICs 110, the techniques herein may be used with other types of hardware components or devices (e.g., photonic chips, environmental or biological sensors, and the like).

The ICs 110 each include respective self-test circuitry 115 used to capture measurements when testing the ICs 110. As shown, a testing apparatus 120 includes probes 125 which can be electrically coupled to the ICs 110. Using the self-test circuitry 115, a testing controller 130 can receive test data 140 from the ICs 110. In one embodiment, the testing controller 130 executes a test program 135 which provides instructions or commands to the self-test circuitry 115. In response, the self-test circuitry 115 captures measurements corresponding to different hardware elements in the ICs 110. For example, the test program 135 may instruct the self-test circuitry 115 to test the hardware elements in the ICs 110 to determine test data 140 corresponding to the minimum operating voltage, minimum and maximum power consumption, maximum clock speed, Block RAM speed, PCIe performance, digital signal processing (DSP) performance, and the like for the ICs 110. That is, the test program 135 may be a more comprehensive testing program than the typical tests used in a fixed binning process. For example, in the fixed binning process, the testing apparatus 120 may test only a handful of different performance parameters to determine if they pass or fail thresholds in a test specification. However, in the embodiments herein, the testing apparatus 120 may test hundreds of different performance and power parameters rather than only the parameters related to a particular test specification (e.g., test specification 155). Thus, the comprehensive test data 140 can be used to re-bin the ICs 110 if the test specification 155 changes or if a different test specification 155 is provided.

The embodiments herein are not limited to any particular type of self-test circuitry 115 or testing protocol to generate the test data 140. For example, the binning process 100 may use test access ports, test registers, boundary-scan architecture, and other debugging techniques which may test the hardware elements in the ICs 110. In one embodiment, the self-test circuitry 115 may include non-volatile storage memory and/or firmware which can be used to test the hardware elements in the ICs 110 to generate the test data 140.

The testing apparatus 120 transmits the test data 140 to a binning system 150 which includes binning algorithms 160 for categorizing the ICs 110 into one of the bins 170. Although not shown, the test data 140 may be stored in a data store 165 which is also used to store mappings between the ICs 110 and the bins 170. To bin the ICs, the binning algorithms 160 use a test specification 155 which provides criteria for evaluating the test data 140. For example, the test specification 155 may include one or more thresholds for evaluating the power consumption of the ICs 110. In one embodiment, the test specification 155 establishes a threshold that an IC 110 must have to qualify for a particular bin. For example, the ICs may need a minimum clock speed or maximum power consumption in order to be categorized into one of the bins 170. That is, the binning algorithms 160 may add an IC 110 to one of the bin 170 only if the IC 110 satisfies the minimum requirements. The details of the binning algorithms 160 are described in more detail below.

In one embodiment, the binning system 150 may use multiple test specifications 155 to bin the ICs 110. For example, each customer or each product may have its own set of test specifications 155 which list the desired functionality or performance of the ICs 110. In one embodiment, the test specifications 155 are considered separately. That is, the binning algorithms 160 may use the test data 140 to determine which of the bins 170 to assign the ICs 110 for each individual test specification 155. However, in another embodiment, the binning algorithms 160 may consider multiple test specifications (e.g., a combination of test specifications 155) when binning the ICs 110. For example, one test specification 155 may indicate the minimum requirements needed to be assigned to the bins 170 while another test specification represents the current demand for the product. The binning algorithms 160 may use both test specifications 155 when assigning the ICs to the bins 170.

The data store 165, which can be a database or other type of data organization platform, stores the bins 170. In one embodiment, each of the ICs 110 can be categorized into only one of the bins 170. However, in other embodiments, the ICs 110 may be categorized into multiple bins 170. For example, one bin 170 may list the ICs that can be placed in a first product while a second bin 170 lists the ICs that can be placed in a second product (which may correspond to two different test specifications 155). If the test data 140 for one of the ICs 110 satisfies the requirements for both test specifications, then the binning algorithms 160 may assign the IC 110 in both bins 170.

In one embodiment, assigning an IC 110 to a bin 170 indicates that the ICs 110 can be used in (or is compatible with) a product or data sheet. In another embodiment, the bins 170 each list ICs 110 that meet the requirements of a particular customer, or have a particular trait (e.g., high performance or low power consumption). In this manner, the binning system 150 can categorize the ICs 110 in response to varying criteria specified in the test specification(s) 155.

The bins 170 stores IC identifications (IDs) 175 which, in one embodiment, uniquely identify the ICs 110. That is, each IC 110 may be assigned a unique IC ID 175 which can be used to track the ICs 110. In one embodiment, the IC IDs 175 may be printed onto the ICs 110 or a package containing the ICs 110. For example, the packaging may include a 1D, 2D, or 3D scannable code (e.g., bar code or QR code). By scanning the code, the scanner can identify the ID 175 for the IC 110 for data encoded in the code. Storing the IC IDs 175 in the bins 170 electronically assigns the corresponding IC 110 to the bin 170.

Figure 2A:
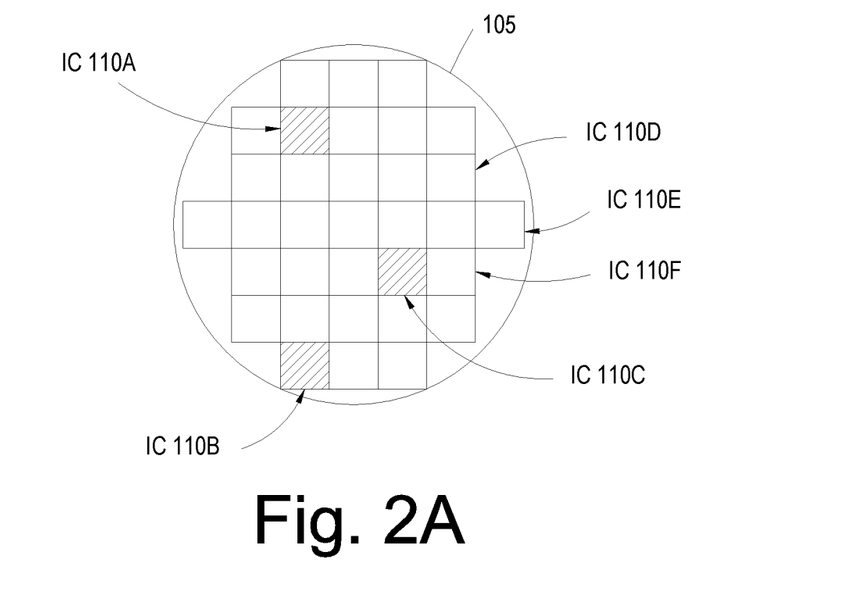
FIGS. 2A and 2B illustrate assigning ICs in a wafer into bins, according to an example.
Figure 2B:
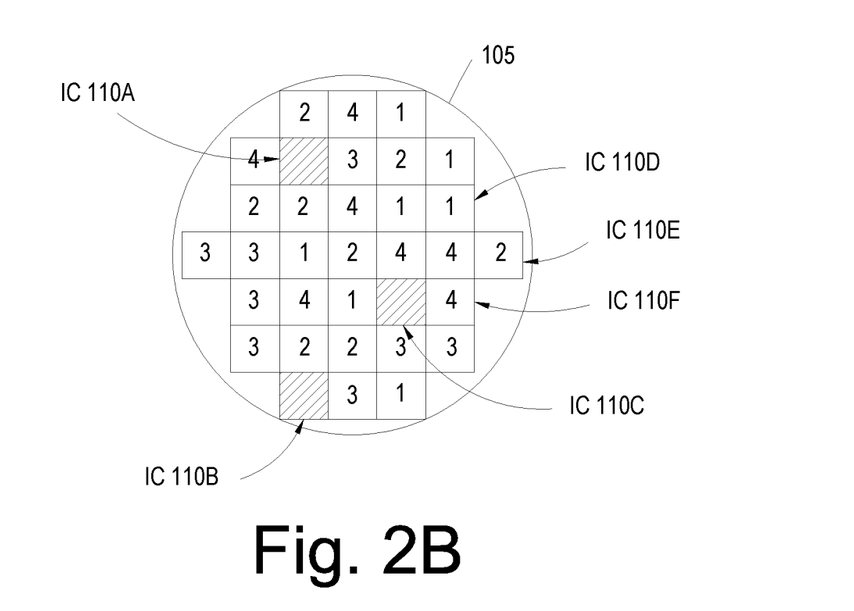

FIGS. 2A and 2B illustrate assigning the ICs 110 in the wafer 105 into bins, according to an example. FIG. 2A illustrates that status of the ICs 110 after evaluating the test data corresponding to the ICs 110 using the test specification. In this embodiment, the binning system first checks the ICs to determine if they meet a minimum standard or minimum performance. For example, the test specification may require that the ICs have a clock speed above X GHz and can perform X number of read/writes in the block RAM every second. The shading in FIG. 2A indicates which of the ICs do not meet the minimum standard or performance. In this example, ICs 110A, 110B, and 110C do not meet the minimum standard while the other ICs (e.g., IC 110D-F and all other non-shaded ICs 110) meet the minimum standards. In one embodiment, the ICs 110A-C are not binned.

FIG. 2B illustrates the results of binning the ICs 110 that satisfy the minimum requirements. In this example, the unshaded ICs 110 each correspond to a number which indicates their assigned bin—e.g., Bin 1, Bin 2, Bin 3, and Bin 4. For example, the IC 110D is assigned to Bin 1, the IC 110E is assigned to Bin 2, while the IC 110F is assigned to Bin 4. The test specification (or specifications) may indicate different ranges for performance parameters. Depending where the test data for the ICs 110 fall in the ranges determines which bin the ICs are assigned. Moreover, the bins may consider multiple different performance or power parameters when binning the ICs.

Figure 3:
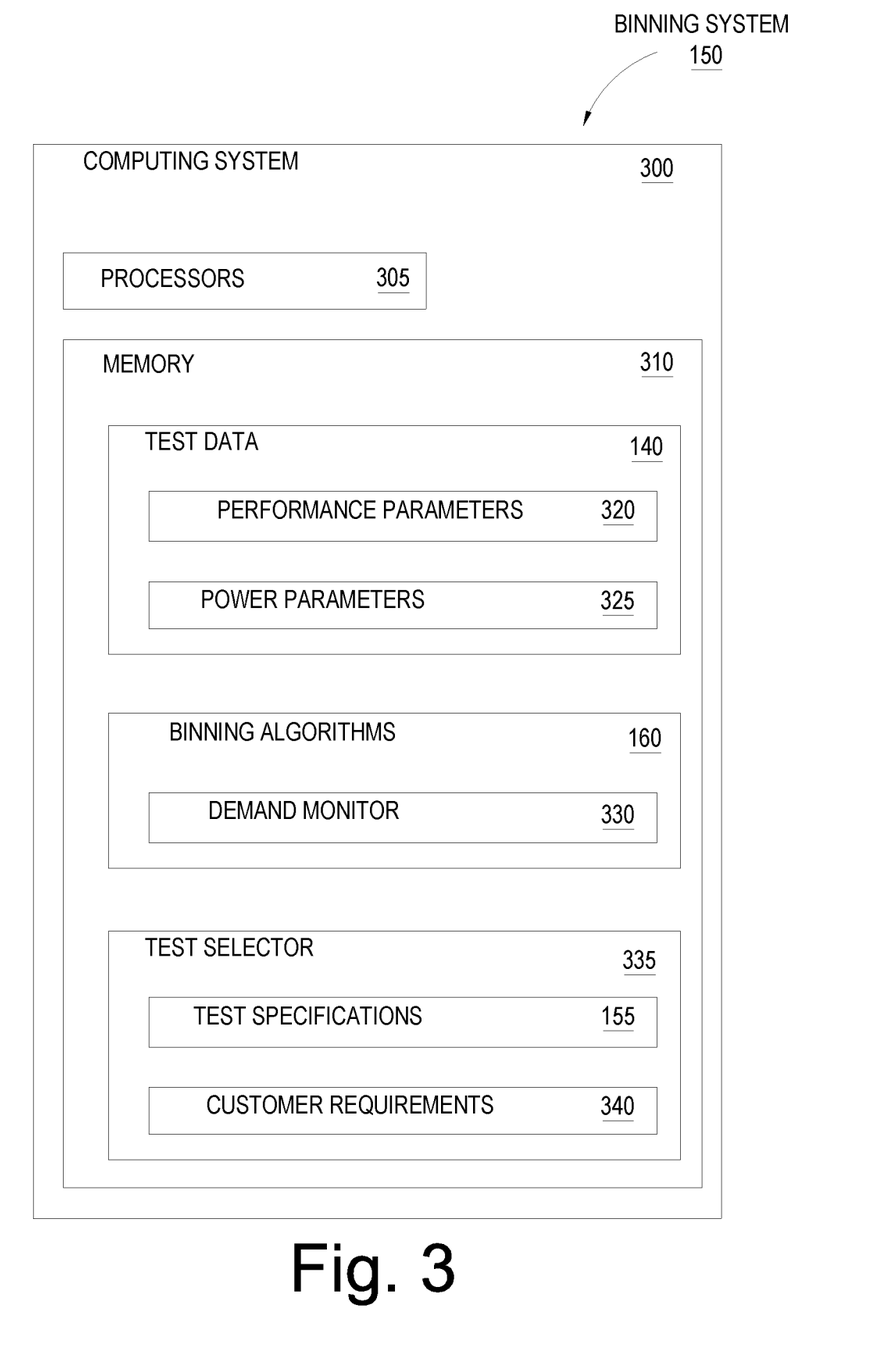
FIG. 3 is a block diagram of a binning system, according to an example.

FIG. 3 is a block diagram of the binning system 150, according to an example. The binning system 150 includes a computing system 300 which has processors 305 and memory 310. The processors 305 represent any number of processing elements that each can contain any number of processing cores. The memory 310 can include non-volatile memory elements, volatile memory elements, or combinations of both.

The memory 310 includes the test data 140, the binning algorithms 160, and a test selector 335. As shown, the test data 140 includes performance parameters 320 which can include clock speed, block RAM speed, PCIe performance, DSP performance, etc. of the ICs. The test data 140 also includes power parameters 325 which can include minimum operating voltages, power consumed, heat generation, and the like. The performance parameters 320 and the power parameters 325 can be measured by, for example, the testing apparatus 120 shown in FIG. 1.

The binning algorithms 160 (e.g., a software application) include a demand monitor 330 which monitors customer demand for the different ICs (or packages/products that include the ICs) produced by the manufacturer. For example, the demand monitor 330 may determine the current rate at which one type of ICs (e.g., a specific processor) is being sold which indicates the demand for that product—e.g., 50 units are sold each month. As customers order more of a product, the demand monitor 330 can re-calculate the demand for the product.

In one embodiment, the demand monitor 330 determines a predictive demand for the different ICs. For example, using historical data (e.g., the number of units sold last month or the number of units sold in the same month over the last several years), the demand monitor 330 can estimate the demand for the products in the next month. Moreover, the demand monitor 330 can change the current demand or future demand in response to changes such as a new order or a cancelled order. Thus, the demand monitor 330 can adapt the demand for the products in response to changing circumstances. The binning algorithms 160 can use the demand generated by the demand monitor 330 to bin (or re-bin) the ICs.

The test selector 335 (e.g., a software application) includes the test specifications 155 and the customer requirements 340. A customer may send new or updated requirements 340 which the test selector 335 can use to update or add new test specifications 155. For example, the customer may want a processor with a specific set of requirements 340 for a new product. The test selector 335 can use the new requirements 340 to generate a new test specification 155. The binning algorithms 160 can use the new test specification 155 to re-bin the ICs. In another example, the customer may later discover that the original requirements 340 were too stringent and thus relax some of the performance parameters in the customer requirements 340 (e.g., lower the thresholds). The test selector 335 can update the test specification 155 to reflect the new thresholds and the binning algorithms 160 can re-bin the ICs during which the ICs may be assigned to different bins. In this manner, the binning system 150 can respond to changes in customer requirements 340 and demand and re-bin the ICs that have no yet been sold—i.e., ICs still in inventory.

Figure 4:
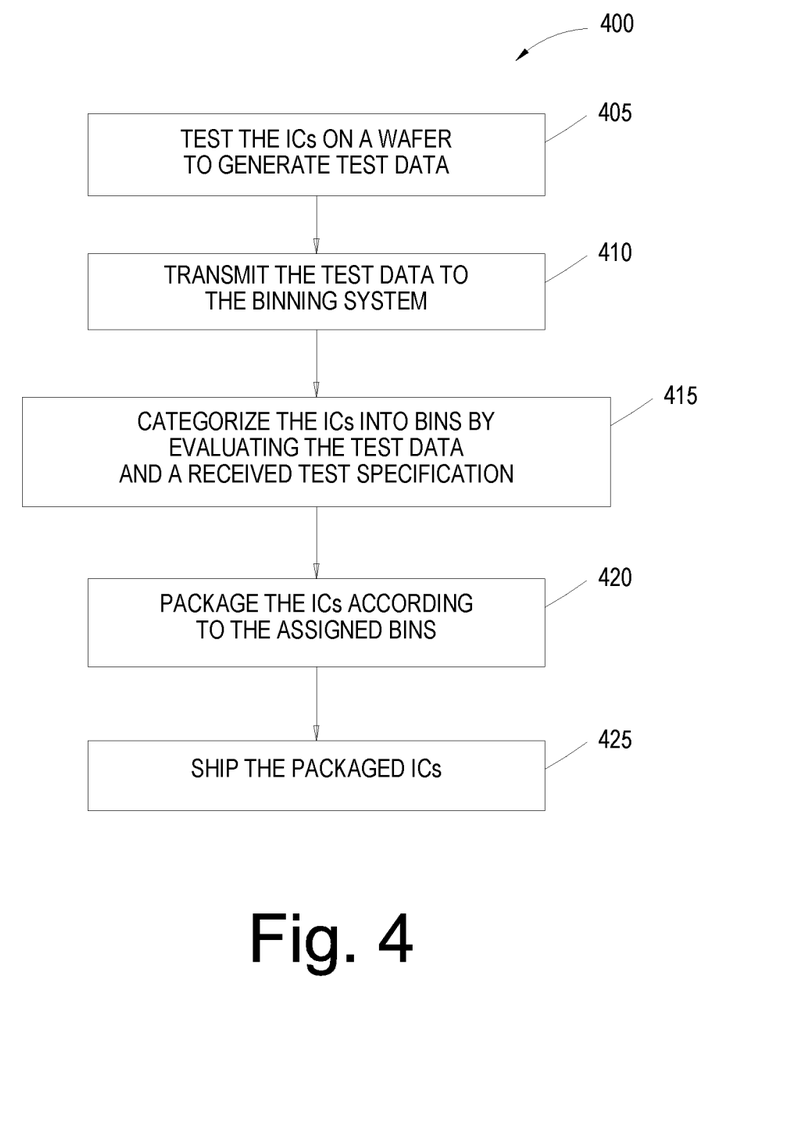
FIG. 4 is a flowchart for binning ICs, according to an example.

FIG. 4 is a flowchart of a method 400 for binning ICs, according to an example. At block 405, a testing apparatus tests ICs on a wafer to generate test data. In one embodiment, the testing apparatus sends commands to testing circuitry in the ICs which then test the hardware elements in the IC to determine performance and power parameters corresponding to the ICs. However, in other embodiments, the testing apparatus may test the ICs without using embedded test circuitry or logic. Instead, the testing apparatus may use an I/O interface in the ICs for transmitting and receiving digital and/or analog information from the ICs. The testing apparatus can store these measurements as test data.

Although the ICs may be disposed on a wafer when being tested, the embodiments are not limited to such. Alternatively, the ICs can be tested after the wafer has been cleaved or sawed to separate the ICs into individual components. For example, the ICs may be attached to a printed circuit board or other substrate material before being attached to the testing apparatus to measure the test data.

At block 410, the testing apparatus transmits the test data to the binning system. As mentioned above, the test data can include both performance and power parameters for the tested ICs. However, in other examples, the test data may include only one or the other, or include other types of parameters other than the ones listed here.

The binning system can store the test data in a data store. That way, the test data can be available to bin or re-bin the ICs as circumstances change such as change in customer requirements or demand. Thus, instead of the testing apparatus testing the ICs using the test specification to determine the bins, here the binning system stores the test data so that the ICs can be re-binned in response to changed circumstances without having to re-test the ICs.

At block 415, the binning system categorizes the ICs into bins by evaluating the test data and received test specification. In one embodiment, the test specification corresponds to a specific product or data sheet. For example, when offering the ICs for sell, the manufacturer may have different data sheets for different purposes. For example, one data sheet may describe "high-performance ICs" while a second data sheet describes "low-power consumptions ICs" and a third data sheet describes "economically ICs" which have different trade-offs. That is, the performance and power parameters for the ICs may differ. The binning system can use the different data sheets to bin the products (e.g., a bin for each of the data sheets). In one embodiment, the binning system may generate a test specification using the three data sheets to categorize the ICs into the bins. In this manner, the binning system can identify which ICs satisfy the different data sheets. In one embodiment, each of the data sheets can correspond to a different SKU or product code.

As an example, the ICs may all be the same type of RAM (e.g., the same size and model) but because of process variations during fabrication, the RAM chips can have different performance and power parameters. For example, a first RAM chip may be able to perform more read/writes every minute, but consumes more power, than a second RAM chip in the wafer. As such, using the test specification, the binning system may assign the first RAM chip to the "high-performance" bin and assign the second RAM chip to the "low-power consumption" bin. A third RAM chip may have lower read/write operation speeds and consume a large amount of power (which is typically undesirable). The binning system may assign the third RAM chip to the "economical" bin which may have a lower price point than the ICs in the "high-performance" or "low-power consumption" bins. The test specification may include different ranges for the performance and power parameters in the test data which dictate into which bin the ICs are assigned. For example, to be in the "high-performance" bin, the RAM chip may have to perform at least X number of read/write per second and to be in the "low-power consumption" bin the RAM chip may have to consume less than X mWatts during operation.

In one embodiment, the ICs can be categorized in multiple bins. For example, a RAM chip with operational speeds above X number of read/writes per second and power consumption below X mWatts may be grouped in both the "high-performance" and "low-power consumption" bins. Alternatively, in another embodiment, the test specification may be designed such that the ICs can only be placed in one of the bins. For example, the binning system and algorithms may use weights to determine which bin the ICs should be assigned. The "economical" bin may be a catch-all which includes all the ICs that do not qualify for any other bin.

The customer can choose, using the data sheets, which product it wants. For example, if the IC is going in a high-performance computing system such as a data center server, the customer may purchase the ICs in the "high-performance" bin even though these ICs may consume more power than the ICs in other bins. In contrast, if the customer is planning on using the ICs in a mobile device powered by a batter, low power consumption may be more important that increased performance, and thus, the customer may purchase the ICs assigned to the "low-power consumption" bin. In this manner, the binning system can categorize the ICs (which may be the same part) into different bins which have different performance and power parameters arising from variances in the fabrication process.

At block 420, the manufacturer packages the ICs according to the assigned bins. In one embodiment, the ICs are packaged after being purchased by a customer. For example, the ICs may be packaged to suit the requirements of the purchasing customer which may vary. For example, the packaging may include a specific logo of the customer or the IC may be placed on a specific type of substrate (e.g., a PCB or interposer).

At block 425, the manufacturer ships the packages ICs to the purchasing customer. In one embodiment, once purchased, the binning system may update the data store containing the bins to indicate the ICs have been purchased. For example, the binning system may flag the entries corresponding to the IC IDs in the bins to indicate the ICs have been sold. In another embodiment, the binning system may delete the entry from the bin (or bins if the IC is in multiple bins) when the IC is sold. In this manner, the binning system can track the number of available ICs in each of the bins.

Figure 5:
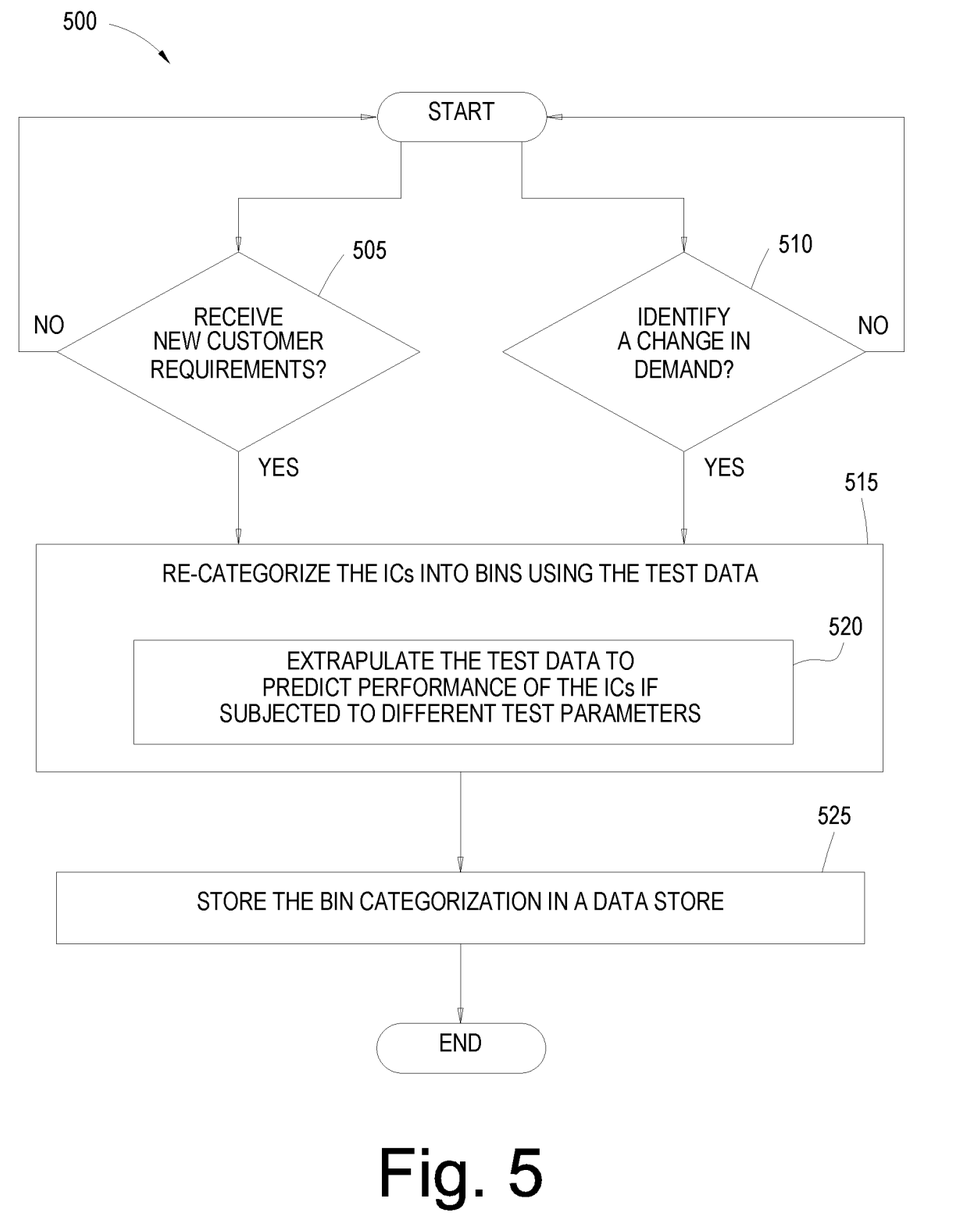
FIG. 5 is a flowchart for re-binning ICs using a new test specification, according to an example.

FIG. 5 is a flowchart of a method 500 for re-binning ICs using a new test specification, according to an example. As shown, the method 500 can start with block 505 or block 510. In other words, the blocks 505 and 510 can occur in parallel and are not dependent on each other. In one embodiment, the blocks 505 and 510 are examples of re-binning events during which criteria or thresholds in the test specification are updated.

At block 505, the test selector in the binning system determines whether new customer requirements are received. The customer may change its requirements for a product in response to any number of factors. For example, the customer may determine that another part in its product is drawing a lot of a power, and thus, needs to purchase ICs that draw less power (e.g., are more energy efficient). In another example, the customer may discover that a particular component in the IC (e.g., the block RAM) is critical to improving the overall performance of the product in which the IC is placed. As such, the customer may indicate to the manufacturer that it wants ICs that have block RAM operation speeds in a defined range.

The binning system or algorithms can update the test specification(s) in response to the changes in customer requirements. Using the examples above, the binning system may add a new bin to identify the most energy efficient ICs or change the thresholds corresponding to the energy efficient bin so that the ICs in the bins meet the customer requirements. In regards to block RAM speed, the binning system may update the test specification to ensure ICs with sufficient RAM speed are identified and binned accordingly. For example, the test specification may indicate that ICs with block RAM speeds that satisfy the customer requirements are placed in a new bin.

Because the test data is comprehensive, it can still be used when the test specification is changed. For example, the previous test specification may have wanted to know which ICs have block RAM speed above a first threshold, but now may want to know which ICs have black RAM speeds above a second, higher threshold. Because the test data may have determined the maximum block RAM speed for all the ICs (rather than simply identifying whether the block RAM speed is above the first threshold), the test data can be used for re-binning the ICs after the test specification is updated. In another example, the test data may include values for a performance parameter or power parameter which are absent (or not used) in the original test specification but are used in the updated test specification. For example, previously the customer may not have asked to bin the ICs based on their block RAM speed, but now does in the updated test specification. Because the test data can include values for hundreds of different performance and power parameters, the test data can be used to re-bin the ICs as criteria for different performance parameters are added to the test specification.

In parallel, at block 510, the binning system can determine whether there is a change in demand for the ICs (or the products that contain the ICs). As mentioned above, the demand monitor can use historical and/or current demand data to determine the current or future demand for the IC. For example, using past sales, the demand monitor can predict the future demand for the different ICs sold by the manufacturer. Or the demand monitor can consider the historical rate of customer orders to predict the future orders for the product/IC. In addition, the demand monitor can track cancellations which can reduce the current or predicted demand for the product.

In one embodiment, the demand monitor identifies a trend line using the historical or current order data for the product which can be extended to predict the future demand for the product. The binning system may change the test specification(s) in response to changing demand. As an example, the demand monitor may determine that a hundred ICs have been ordered for a particular month, but in the middle of the month, the demand increases such that there is a scarcity of available ICs. Before the demand changed, the binning system may have binned the products into two bins: "high-performance" and "low power." As discussed above, some of the ICs may satisfy the minimum requirements of both of these bins while other ICs may not have. Now that demand has increased, the binning system may update the test specification and add a third bin that includes the ICs that satisfy the minimum requirements of both bins since these ICs are more valuable because they can be sold to customers who ask for either high-performance ICs or low power ICs. The binning system may be unable to predict which type the customers will order, but by adding the third bin, the binning system can separate from the original two bins the ICs that satisfy the requirements of both bins. Thus, when new customer orders arrive, the binning system can satisfy the orders using the ICs from the two original bins. Once the ICs in those bins are exhausted, the binning system can satisfy the new orders using the ICs in the third bin since these ICs will meet the customer's requirements regardless if the customer order high-performance or low-power parts. In this manner, the binning system can increase the chances the manufacturer can satisfy all the orders received from the customer.

At block 515, the binning system re-categorizes the ICs into bins using the test data and the new or updated test specifications determined at block 505 or block 510. That is, because the test data for the ICs has been stored, when the test specification changes, the binning system can re-execute the binning process by evaluating the test data using the updated or new test specification. As a result, some or all of the ICs may be assigned to a different bin or bins. For example, if the customer determines it needs ICs with lower power consumption, the binning algorithms may evaluate the test data to determine which of the ICs meet the more stringent power demands made by the client which are indicated in the updated test specification. As a result, some of the ICs that were previously assigned to the "low power" bin may be removed from this bin after block 515 has been performed.

In addition, at block 520, the binning algorithms extrapolate the test data to predict performance of the ICs if subject to different test parameters. That is, in addition to evaluating the actually measured test data, the binning algorithms can extrapolate the measured test data to generated predicted test data as if the test parameters used to test the ICs were different. For example, the testing apparatus may have measured the test data for the ICs in a hot environment (e.g., 40 degrees Celsius) and a cold environment (e.g., 0 degrees Celsius). However, the customer or manufacturer may determine that the ICs are typically used in hotter environments where the average temperature is closer to 50 degrees Celsius. In response, the binning algorithms can extrapolate the test data measured at 40 degrees Celsius to predict the values of the test data at 50 degrees Celsius. For example, the testing apparatus may have determined the maximum clock operation speed and the power consumption of the IC at 40 degrees Celsius but the binning algorithms can use this information to extrapolate the maximum clock operation speed and the power consumption of the IC at 50 degrees Celsius. Thus, as the test specification changes, the binning algorithms can also update or extrapolate the test data to perform more accurate binning. However, block 520 is optional and is not necessary when re-categorizing the ICs at block 515. Put differently, the binning algorithms may not need to extrapolate the test data in order to accurately re-bin the ICs in responses to changes in the test specification.

At block 525, the binning system stores the bin categorization in a data store. Referring to FIG. 1, the binning system 150 can assign the IC IDs 175 to the bins 170 in the data store 165. That is, in response to re-categorizing the ICs, the binning system 150 may move the IC IDs 175 into different bins 170. In this manner, the manufacturer can save the bins to track inventory and fulfill customer orders.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects described herein may take the form of an entirely hardware embodiment, an entirely software embodiment (including firmware, resident software, micro-code, etc.) or an embodiment combining software and hardware aspects that may all generally be referred to herein as a "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, FPGAs, or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:
1. A method comprising:
  testing a plurality of integrated circuits to measure test data, wherein the test data comprises at least one of a performance parameter and a power parameter for the plurality of integrated circuits;

categorizing the plurality of integrated circuits into a plurality of bins by evaluating the test data using a test specification, wherein the test specification includes one or more criteria used to evaluate at least one of the performance parameter and the power parameter to assign the plurality of integrated circuits to at least one of the plurality of bins;

determining a re-binning event where the test specification is changed, wherein the re-binning event comprises one of receiving a change in customer requirements and a change in demand; and re-categorizing the plurality of integrated circuits by evaluating the test data using the changed test specification where at least one of the plurality of integrated circuits is assigned to a different one of the plurality of bins.

2. The method of claim 1, wherein the test data comprises values for at least one performance parameter and power parameter that is absent from the test specification, wherein determining the re-binning event comprises:

receiving the change in the customer requirements for the plurality of integrated circuits, wherein the change in the customer requirements comprises criteria corresponding to the at least one performance parameter and power parameter that is absent from the test specification; and updating the test specification to add the criteria corresponding to the at least one performance parameter and power parameter into the changed test specification.

3. The method of claim 1, wherein determining the re-binning event comprises:

determining the change in customer demand for the plurality of integrated circuits; and updating the test specification to bin the plurality of integrated circuits based on the change in customer demand.

4. The method of claim 1, wherein re-categorizing the plurality of integrated circuits comprises:

receiving a desired environmental parameter that is different from a previous environmental parameter used when testing the plurality of integrated circuits to generate the test data;

extrapolating the test data to identify predicted test data corresponding to operating the plurality of integrated circuits at the desired environmental parameter, wherein the plurality of integrated circuits is re-categorized using the extrapolated test data.

5. The method of claim 1, further comprising, after re-categorizing the plurality of integrated circuits:

receiving a customer order for the plurality of integrated circuit with a desired characteristic;

identifying a first bin of the plurality of bins that corresponds to the desired characteristic; and selecting at least a portion of the plurality of integrated circuits assigned to the first bin to satisfy the customer order.

6. The method of claim 5, further comprising:
packaging the at least portion of the plurality of integrated circuits;
shipping the packaged integrated circuits; and
updating a data store storing the first bin to indicate the packaged integrated circuits have been sold.

7. The method of claim 1, wherein, when testing the plurality of integrated circuits to generate the test data, the plurality of integrated circuits are part of a common wafer, wherein the method further comprises:

cleaving the common wafer after testing the plurality of integrated circuits.

8. The method of claim 1, wherein re-categorizing the plurality of integrated circuits is performed without re-testing the plurality of integrated circuits.

9. A computing system, comprising:
a processor; and
a memory comprising binning algorithms that, when executed by the processor performs an operation, the operation comprising:

receiving test data generated by testing a plurality of integrated circuits, wherein the test data comprises at least one of a performance parameter and a power parameter for the plurality of integrated circuits;

categorizing the plurality of integrated circuits into a plurality of bins by evaluating the test data using a test specification, wherein the test specification includes one or more criteria used to evaluate at least one of the performance parameter and the power parameter to assign the plurality of integrated circuits to at least one of the plurality of bins;

determining a re-binning event where the test specification is changed, wherein the re-binning event comprises one of receiving a change in customer requirements and a change in demand; and re-categorizing the plurality of integrated circuits by evaluating the test data using the changed test specification where at least one of the plurality of integrated circuits is assigned to a different one of the plurality of bins.

10. The computing system of claim 9, wherein determining the re-binning event comprises:

receiving the change in the customer requirements for the plurality of integrated circuits; and updating the test specification to bin the plurality of integrated circuits based on the change in the customer requirements.

11. The computing system of claim 9, wherein the memory comprises a demand monitor configured to:

determine the change in customer demand for the plurality of integrated circuits; and instruct the binning algorithms to update the test specification to bin the plurality of integrated circuits based on the change in customer demand.

12. The computing system of claim 9, wherein re-categorizing the plurality of integrated circuits comprises:

adding a new bin to the plurality of bins, wherein the at least one of the plurality of integrated circuits is assigned to the new bin.

13. The computing system of claim 9, wherein re-categorizing the plurality of integrated circuits comprises:

receiving a desired environmental parameter that is different from a previous environmental parameter used when testing the plurality of integrated circuits to generate the test data; and extrapolating the test data to identify predicted test data corresponding to operating the plurality of integrated circuits at the desired environmental parameter, wherein the plurality of integrated circuits is re-categorized using the extrapolated test data.

14. The computing system of claim 9, wherein the operation further comprises, after re-categorizing the plurality of integrated circuits:

receiving a customer order for the plurality of integrated circuit with a desired characteristic;

identifying a first bin of the plurality of bins that corresponds to the desired characteristic; and selecting at least a portion of the plurality of integrated circuits assigned to the first bin to satisfy the customer order.

15. A computer readable storage medium comprising:
computer-readable program code for binning a plurality of integrated circuits, wherein, when executed by a computing processor, the computer-readable program code performs an operation comprising:
   receiving test data generated by testing a plurality of integrated circuits, wherein the test data comprises at least one of a performance parameter and a power parameter for the plurality of integrated circuits;
   categorizing the plurality of integrated circuits into a plurality of bins by evaluating the test data using a test specification, wherein the test specification includes one or more criteria used to evaluate at least one of the performance parameter and the power parameter to assign the plurality of integrated circuits to at least one of the plurality of bins;
   determining a re-binning event where the test specification is changed, wherein the re-binning event comprises one of receiving a change in customer requirements and a change in demand; and
   re-categorizing the plurality of integrated circuits by evaluating the test data using the changed test specification where at least one of the plurality of integrated circuits is assigned to a different one of the plurality of bins.

16. The computer readable storage medium of claim 15, wherein determining the re-binning event comprises:
   receiving the change in the customer requirements for the plurality of integrated circuits; and
   updating the test specification to bin the plurality of integrated circuits based on the change in the customer requirements.

17. The computer readable storage medium of claim 15, wherein determining the re-binning event comprises:
   determining the change in customer demand for the plurality of integrated circuits; and
   updating the test specification to bin the plurality of integrated circuits based on the change in customer demand.

18. The computer readable storage medium of claim 15, wherein re-categorizing the plurality of integrated circuits comprises:
   receiving a desired environmental parameter that is different from a previous environmental parameter used when testing the plurality of integrated circuits to generate the test data; and
   extrapolating the test data to identify predicted test data corresponding to operating the plurality of integrated circuits at the desired environmental parameter, wherein the plurality of integrated circuits is re-categorized using the extrapolated test data.

19. The computer readable storage medium of claim 15, wherein the operation further comprises, after re-categorizing the plurality of integrated circuits:
   receiving a customer order for the plurality of integrated circuit with a desired characteristic;
   identifying a first bin of the plurality of bins that corresponds to the desired characteristic; and
   selecting at least a portion of the plurality of integrated circuits assigned to the first bin to satisfy the customer order.

20. The computer readable storage medium of claim 15, wherein re-categorizing the plurality of integrated circuits is performed without re-testing the plurality of integrated circuits.

* * * * *

UNITED STATES PATENT AND TRADEMARK OFFICE
CERTIFICATE OF CORRECTION

PATENT NO. : 10,761,137 B1  
APPLICATION NO. : 15/860925  
DATED : September 1, 2020  
INVENTOR(S) : Lee N. Chung et al.

Page 1 of 1

It is certified that error appears in the above-identified patent and that said Letters Patent is hereby corrected as shown below:

In the Claims

Column 14, Line 9, In Claim 9, after "processor" insert -- , --.

Signed and Sealed this  
Twenty-fifth Day of May, 2021

Drew Hirshfeld  
*Performing the Functions and Duties of the*  
*Under Secretary of Commerce for Intellectual Property and*  
*Director of the United States Patent and Trademark Office*